United States Patent [19]

Noguchi et al.

[11] Patent Number: 5,705,833
[45] Date of Patent: Jan. 6, 1998

[54] SURFACE-MOUNTED PHOTOCOUPLER

[75] Inventors: Katsuhiko Noguchi; Megumi Horiuchi, both of Fujiyoshida, Japan

[73] Assignee: Citizen Electronics Co., Ltd., Yamanashi, Japan

[21] Appl. No.: 575,837

[22] Filed: Dec. 20, 1995

[30] Foreign Application Priority Data

Dec. 30, 1994 [JP] Japan .................... 6-339288

[51] Int. Cl.$^6$ ............................ H01L 31/12; H01L 31/16
[52] U.S. Cl. ...................... 257/81; 257/82; 257/80; 257/226; 257/229; 257/290; 257/293; 257/462; 257/458
[58] Field of Search ..................... 257/82, 80, 81, 257/83, 79, 88, 226, 228, 229, 288, 290–293, 434, 447, 458, 462

[56] References Cited

U.S. PATENT DOCUMENTS

| | | | |
|---|---|---|---|
| 4,160,308 | 7/1979 | Courtney et al. | 257/82 |
| 4,626,878 | 12/1986 | Kuwano et al. | 257/80 |
| 5,105,238 | 4/1992 | Nikaido et al. | 257/82 |
| 5,298,768 | 3/1994 | Okazaki et al. | 257/81 |
| 5,506,445 | 4/1996 | Rosenberg | 257/82 |

FOREIGN PATENT DOCUMENTS

| | | | |
|---|---|---|---|
| 0081827 | 6/1983 | European Pat. Off. | 257/82 |
| 0097389 | 8/1979 | Japan | 257/82 |
| 0101475 | 6/1983 | Japan | 257/82 |
| 0106878 | 6/1983 | Japan | 257/82 |
| 0132273 | 5/1992 | Japan | 257/458 |

Primary Examiner—Minh-Loan Tran
Assistant Examiner—Alexander Oscar Williams
Attorney, Agent, or Firm—Koda and Androlia

[57] ABSTRACT

A light-emitting element 22 and a light-receiving element 26 are attached to a circuit board so as to oppose each other across the circuit board 2. As a result, light from the light-emitting element 22 arrives at the light-receiving element 26 via the substrate 2. Since the distance between the light-emitting element 22 and the light-receiving element 23 thus becomes very short, the light conversion efficiency is improved by a wide margin. Further, since the substrate 2 is interposed between the light-emitting element 22 and the light-receiving element 26, the elements are completely isolated within the insulation breakdown voltage of the material constituting the substrate.

8 Claims, 6 Drawing Sheets

SURFACE-MOUNTED PHOTOCOUPLER

BACKGROUND OF THE INVENTION

1. Field of the Invention

This invention relates to a photocoupler in which a signal is capable of being obtained from an output side without contact in response to a signal from an input side. More particularly, the invention relates to a photocoupler of the surface-mounted type.

2. Prior Art

As shown in FIGS. 15 and 16, a conventional photocoupler has a light-emitting diode (hereinafter abbreviated to "LED") 10 and a phototransistor 12, which are die-bonded and wire-bonded to each of a pair of lead frames 2–8, so arranged as to oppose each other in the vertical direction. The LED 10 and phototransistor 12 are sealed with respect to the lead frames 2–8 by the transfer molding of a heat-resistant epoxy resin 14.

The structure of the photocoupler is such that its input and output sides are completely insulated from each other so that the voltage on the input side will not influence the output side. A high isolation voltage is necessary in order to maintain such insulation between the input and output sides. The isolation voltage generally is decided by the distance between the LED and the phototransistor and the distance between the input and output sides along the outer peripheral surface of the photocoupler.

In this conventional photocoupler, a high isolation voltage can be obtained by increasing the distance between the LED 10 and the phototransistor 12. However, a problem which arises is an increase in the external dimensions of the photocoupler.

Further, when the distance between the LED 10 and the phototransistor 12 is increased, there is a decline in the efficiency of conversion of light. As a result, owing to the relationship between light conversion efficiency and isolation voltage, it is difficult to achieve a reduction in size and an increase in performance by changing the distance between the LED and the phototransistor.

Furthermore, in the conventional photocoupler, the LED 10 is damaged by the stress of the epoxy resin 14 caused by transfer molding. In order to prevent such damage to the LED 10, the periphery of the LED is coated with silicone resin 16 at the step prior to transfer molding, thereby protecting the LED. However, this results in an increase in manufacturing steps and, hence, a decline in productivity.

SUMMARY OF THE INVENTION

The present invention has been devised in view of the foregoing problems and its object is to provide a surface-mounted photocoupler which can be reduced in size, furnished with a higher isolation voltage and light conversion efficiency and improved in terms of productivity and reliability.

In the photocoupler of the present invention, the light-emitting element and the light-receiving element are attached to the substrate so as to oppose each other across the substrate. As a result, the light from the light-emitting element arrives at the light-receiving element via the substrate. Thus, in accordance with the invention, the distance between the light-emitting element and the light-receiving element becomes very short, as a result of which the light conversion efficiency is greatly improved. Further, since the substrate is interposed between the light-emitting element and the light-receiving element, the elements are completely isolated within the insulation breakdown voltage of the material constituting the substrate. Accordingly, the photocoupler has a very high isolation voltage.

Further, in the photocoupler of the present invention, it is possible to form a plurality of photocouplers on the aggregate substrate simultaneously and a coating step using silicone resin is unnecessary. The photocoupler of the invention therefore exhibits superior productivity and a high reliability.

BRIEF DESCRIPTION OF THE DRAWINGS

The invention will be better understood and the objects and features thereof other than those set forth above will become apparent when consideration is given to the following detailed description thereof, which makes reference to the following annexed drawings, wherein.

DETAILED DESCRIPTION OF THE INVENTION

Figure 1:
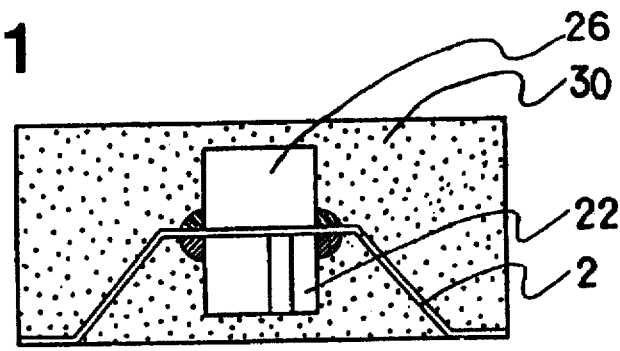
FIG. 1 is a sectional view of a surface-mounted photocoupler according to an embodiment of the present invention.
Figure 2:
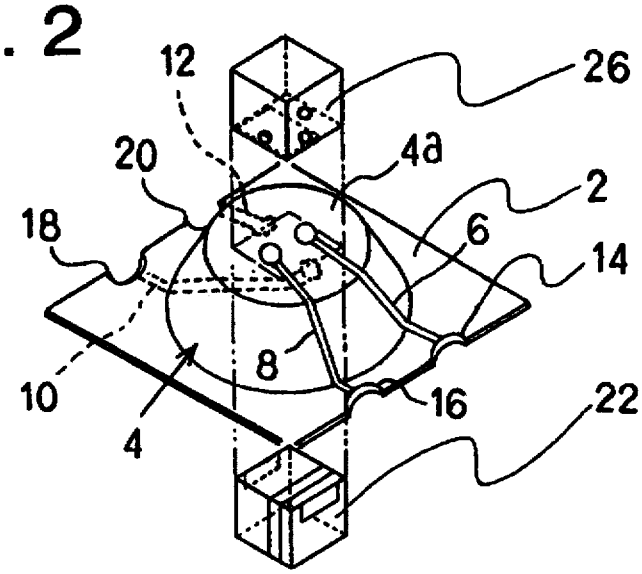
FIG. 2 is an exploded perspective view of the photocoupler shown in FIG. 1.

FIG. 1 is a sectional view of a surface-mounted photocoupler according to an embodiment of the present invention, and FIG. 2 is an exploded perspective view of the same. Numeral 2 denotes a substrate comprising an insulating material exhibiting transparency and heat resistance. The substrate 2 in this embodiment consists of a thermoplastic polyimide film having a thickness of 0.1 mm to several millimeters. The substrate 2 has a centrally located frusto-conical mounting portion 4 the top surface of which defines a protrusion and the bottom surface of which defines a recess. The top and bottom sides of the substrate 2 are formed to have first electrode patterns 6, 8 and second electrode patterns 10, 12, respectively, extending from the edges of the substrate 2 to a horizontal surface 4a at the center of the mounting portion 4. The first and second electrode patterns 6~12 are formed by etching copper. In this embodiment, the patterns formed of copper are plated with gold, nickel or solder. Furthermore, the edges of the substrate 2 are formed to have through-holes 14~20 connected to the first and second electrode patterns 6~12, respectively.

Figure 3:
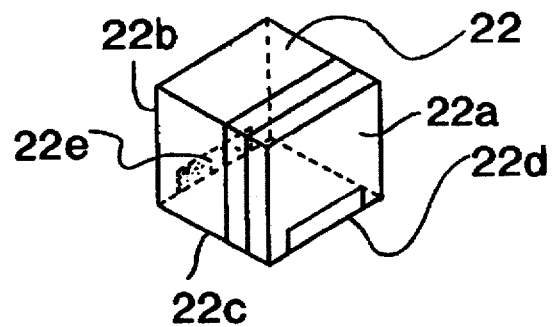
FIG. 3 is an enlarged perspective view of light-emitting element shown in FIG. 2.
Figure 4:
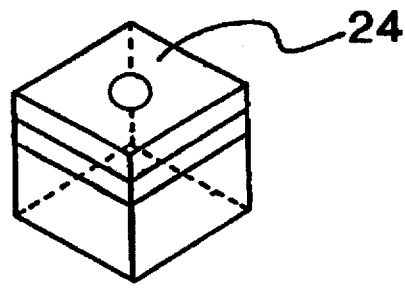
FIG. 4 is a perspective view illustrating a conventional LED.

Numeral 22 denotes a light-emitting element comprising an LED and having a bottom side 22c fixed to the bottom side of the horizontal surface 4a of mounting portion 4 on the substrate 2. As shown in FIG. 3, the light-emitting element 22 in this embodiment is a cube or rectangular parallelepiped having side faces 22a, 22b furnished with electrodes 22d, 22e, respectively, offset toward the bottom side 22c. The electrodes 22d, 22e are electrically connected to the second electrode patterns 10, 12 respectively. In order that the light-emitting element 22 will be capable of emitting light toward the bottom side 22c, the light-emitting element 22 is constructed to have a structure the same as that obtained when a conventional LED 24, having electrodes on its top and bottom sides as shown in FIG. 4, is turned on its side.

Figure 5:
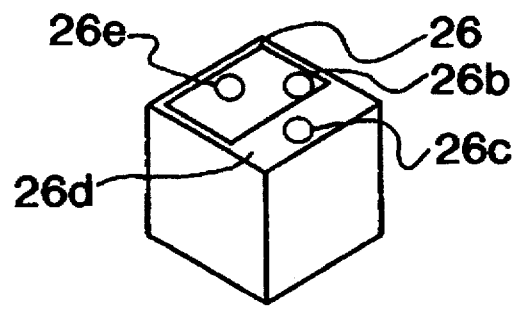
FIG. 5 is an enlarged perspective view of light-receiving element shown in FIG. 2.
Figure 6:
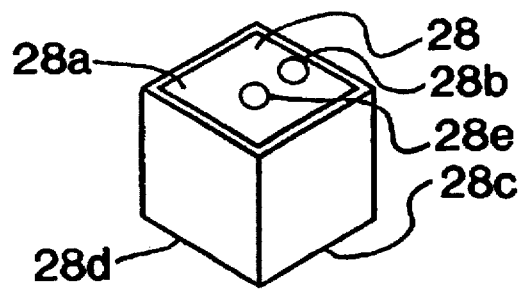
FIG. 6 is a perspective view showing a conventional phototransistor.

Numeral 26 denotes a light-receiving element comprising a phototransistor and having a bottom side 26c fixed to the bottom side of the horizontal surface 4a of mounting portion 4 on the substrate 2. A conventional phototransistor 28 shown in FIG. 6 has a top side 28a provided with a base 28b and an emitter 28e, and a bottom side 28d provided with a collector 28c. By contrast, the phototransistor 26 according to this embodiment has a bottom side 26d on which all of these elements, namely a base 26b, an emitter 26e and a collector 26c, are provided, as shown in FIG. 5. The collector 26c and the emitter 26e are electrically connected to the first electrode patterns 6, 8, respectively, when the bottom side 26d is fixed to the substrate 2.

Numeral 30 denotes a synthetic resin comprising an epoxy resin or the like covering the light-emitting element 22 and the light-receiving element 26. The synthetic resin 30 in this embodiment covers the top and bottom sides of the substrate 2, with the exception of the through-holes 14~20 of the substrate 2, thereby sealing the light-emitting element 22 and the light-receiving element 26. In order to prevent the device from being influenced by external light, the synthetic resin 30 is given a color, such as the color black, which blocks or absorbs external light.

The surface-mounted photocoupler comprising the above-mentioned elements is mounted by being placed on a mother board and having its through-hole electrodes 14~20 fixed to electrode patterns on the mother board as by solder. The photocoupler operates in such a manner that when the light-emitting element 22 is lit by application of signals to the second electrode patterns 10, 12, the light reaches the base 26b of the light-receiving element 26 via the substrate 2 and the light-receiving element 26 is driven into conduction so that signals are outputted by the first electrode patterns 6, 8.

Figure 7:
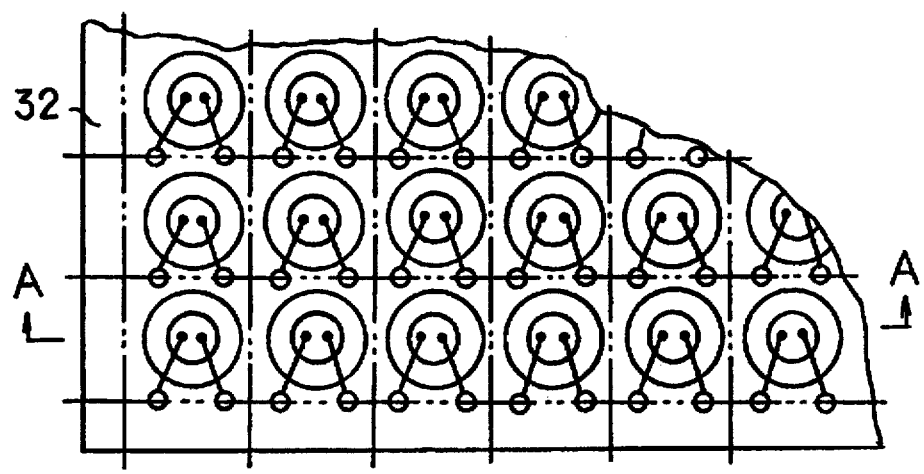
FIG. 7 is a plan view illustrating an aggregate circuit board in a process for manufacturing the photocoupler shown in FIG. 1.
Figure 8:
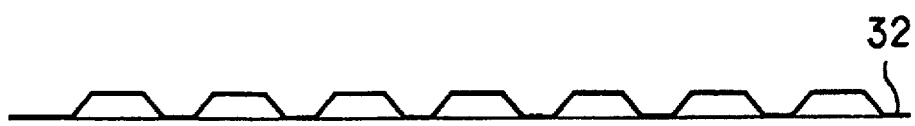
FIG. 8 is a sectional view taken along line A—A of the aggregate circuit board depicted in FIG. 7.

A process for manufacturing the above-described surface-mounted photocoupler will now be set forth. First, as shown in FIGS. 7 and 8, patterns are formed by printing or etching copper on top and bottom sides of a aggregate substrate 32 comprising a thermoplastic polyimide film or the like on which several hundred to a thousand photocouplers are capable of being manufactured, and the patterns or patterns of copper foil thus formed are plated with gold, nickel or solder, thereby forming the first and second electrode patterns 6~12 shown in FIG. 2.

Thereafter, a plurality of the mounting portions 5 shown in FIG. 2 are formed on the aggregate substrate 32 by a heating press or by injection molding or the like.

Next, the light-emitting element 22 and light-receiving element 26 illustrated in FIGS. 3 and 5 are attached to each mounting portion 4 so as to oppose each other across the aggregate substrate 32. The electrodes 22d, 22e of the light-emitting element 22 and the collector 26c and emitter 26e of the light-receiving element 26 are fixed to respective ones of the first and second electrode patterns 6~12 by high-temperature solder or silver epoxy resin, etc.

Furthermore, the entirety of the top and bottom sides of the aggregate substrate 32 with the exception of the through-hole electrode portions are covered by the synthetic resin 30 to seal the light-emitting element 22 and light-receiving element 26.

Finally, the lines along the X and Y axes passing through the centers of the through-hole electrode portions of the aggregate substrate 32 are cut by slicing or the like, whereby the substrate is separated into individual photocouplers.

Figure 9:
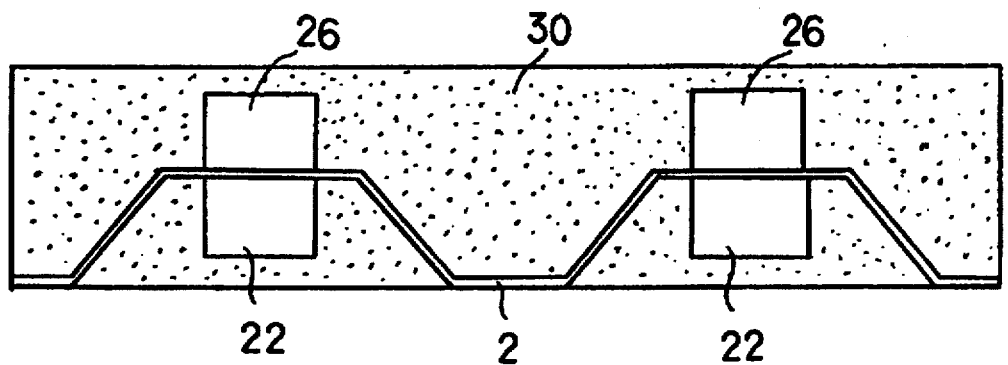
FIG. 9 is a sectional view showing a partial modification of the photocoupler illustrated in FIG. 1.

It should be noted that if the aggregate substrate 32 is cut in the cutting process so as to attain a state in which a plurality of photocouplers are interconnected, a plurality of unified photocouplers as shown in FIG. 9 can be manufactured. The photocouplers can be handled more easily as a single body by forming the synthetic resins 30 of the photocouplers in an interconnected manner.

Figure 10:
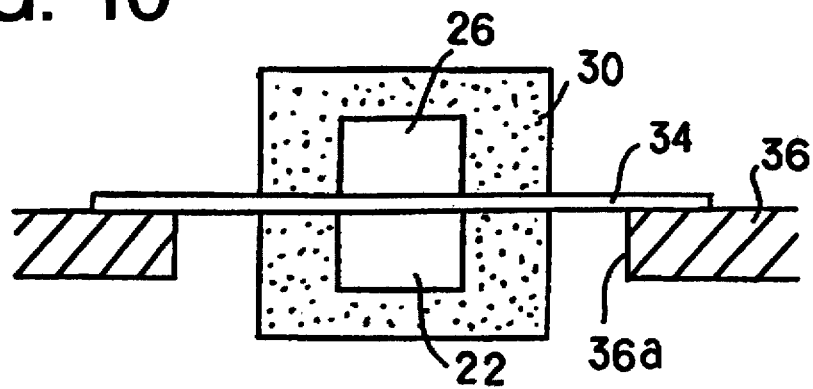
FIG. 10 is a sectional view showing a partial modification of the photocoupler illustrated in FIG. 1.
Figure 11:
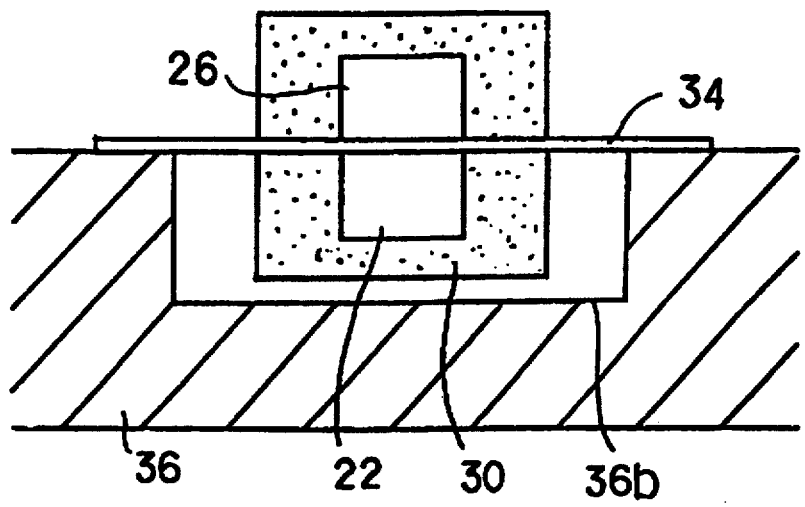
FIG. 11 is a sectional view showing a recess formed in a mother board depicted in FIG. 10.

FIG. 10 is a sectional view showing a partial modification of the surface-mounted photocoupler illustrated in FIG. 1. In the photocoupler depicted in FIG. 10, use is made of a flat, plate-shaped substrate 34 not provided with the mounting portion 4. Using the substrate 34 makes it possible to use a substrate, such as a glass substrate, that does not readily undergo plastic deformation. It also becomes possible to eliminate the step at which the mounting portion 4 is formed. In a case where this photocoupler is mounted on a mother board 36, it is required that the mother board 36 be provided in advance with a hole 36a or a recess 36b, which is shown in FIG. 11, in order to provide a relief for the light-emitting element 22, which is attached to the bottom side of the substrate 34, or for the synthetic resin 30.

Figure 12:
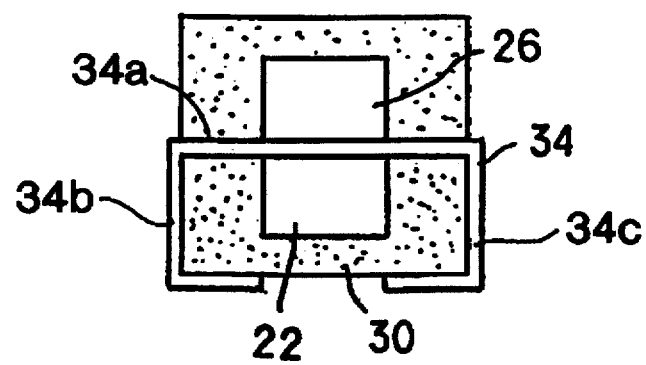
FIG. 12 is a sectional view showing a partial modification of the photocoupler illustrated in FIG. 1.

In the photocoupler shown in FIG. 12, a light-transparent substrate 34 has a flat-mounting portion 34a and edge portions 34b and 34c. The edge portions 34b and 34c of the substrate 34 are bent and affixed or deformed along the outer periphery of the synthetic resin 30, whereby the through-hole electrode portions of the substrate 34 are shifted to the bottom side of the photocoupler to make surface mounting on the mother board easier. In a case where a photocoupler having this structure is manufactured, an additional step is provided in which the substrate 34 is deformed after being separated from the aggregate substrate 32.

Figure 13:
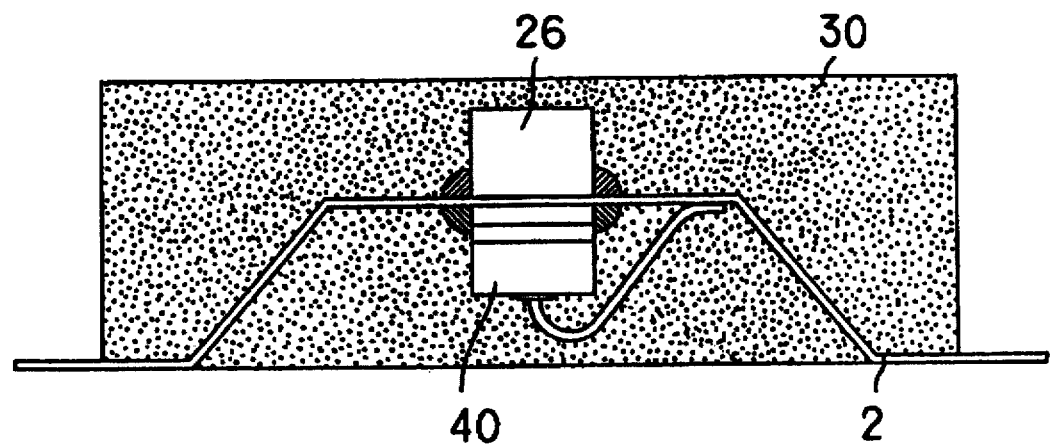
FIG. 13 is a sectional view illustrating another partial modification of the photocoupler shown in FIG. 1.
Figure 14:
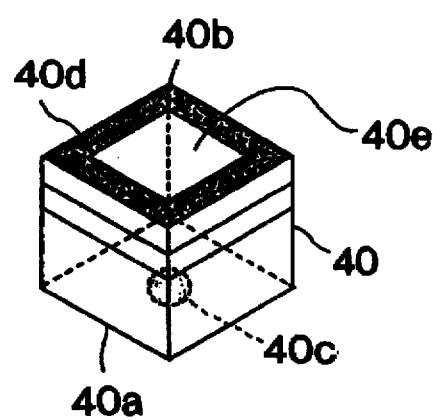
FIG. 14 is a perspective view showing a light-emitting element illustrated in FIG. 13.
Figure 15:
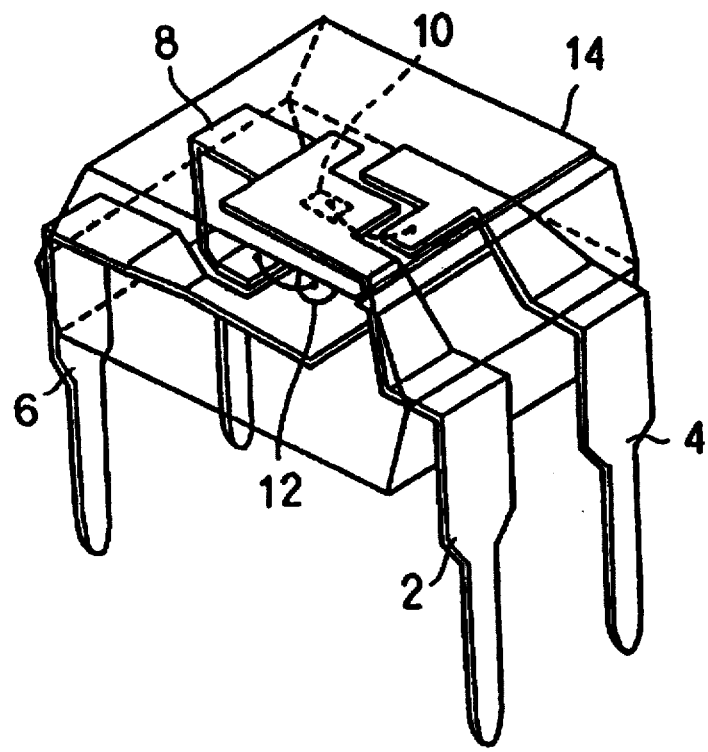
FIG. 15 is a perspective view of a conventional photocoupler.
Figure 16:
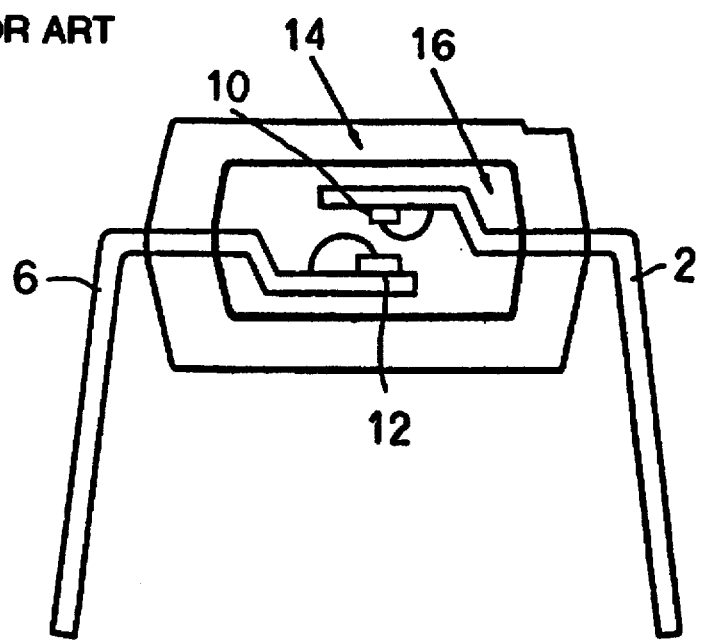
FIG. 16 is a sectional view of the photocoupler illustrated in FIG. 15.

FIG. 13 is a sectional view showing another partial modification of the surface-mounted photocoupler illustrated in FIG. 1. In this photocoupler, a light-emitting element 40 shown in FIG. 14 is fixed to the bottom side of the horizontal surface 41 of the mounting portion 4 of substrate 2. In a manner similar to that of the conventional LED 24 shown in FIG. 4, the light-emitting element 40 has electrodes 40c, 40d capable of being wire bonded and die bonded to top and bottom sides 40a, 40b, respectively. However, the electrode 40d on the bottom side 40b of the light-emitting element 40 is formed to have a frame-shaped configuration that leaves a central portion 40e of the bottom side 40b exposed in such a manner that light emitted toward the bottom side will not be impeded. The light-emitting element 40 is connected by die bonding the electrode 40d to the second electrode pattern 12 on the substrate 2 and wire bonding the electrode 40c to the second electrode pattern 10. Though wire bonding is necessitated by using the light-emitting element 40, a light-emitting element having a structure substantially the same as that of the conventional LED can be used as the light-emitting element 40 and the technique for mounting this on the substrate 2 also is the same as in the prior art. As a result, the reliability of the light-emitting element itself and the reliability of the mounting process can readily be maintained at the same level as that of the prior art. It should be noted that the structural components other than the light-emitting element 40 of the photocoupler shown in FIG. 13 are the same as those shown in FIG. 1. However, in order to maintain the reliability of the connections, a suitable modification may be applied to the shape of the connections between the second electrode patterns 10, 12 and the electrodes 40c, 40d of the light-emitting element 40.

In accordance with present invention, the light-emitting element and the light-receiving element can be placed closely together while a sufficient degree of insulation is maintained between them. As a result, the light conversion efficiency can be greatly improved while maintaining a high isolation voltage.

Further, the distance between the light-emitting element and the light-receiving element can be made very small and a lead frame is not used. This makes it possible to reduce the thickness and size of the photocoupler.

Furthermore, since the light conversion efficiency is improved by a wide margin, the current applied to the light-emitting element can be made very small. This makes it possible to conserve electric power.

Further, since a plurality of photocouplers can be manufactured at the same time using a aggregate circuit board, productivity can be improved by a wide margin.

We claim:

1. A surface-mounted photocoupler comprising;
    a light-transparent substrate including a mounting portion one side of which is projected to form a protrusion and the opposite side of which forms a recess;
    first and second electrode patterns formed on one and other surfaces of said mounting portion, respectively;
    a light-emitting element attached to said one surface of said mounting portion and electrically connected to said first electrode patterns;
    a light-receiving element attached to said other surface of said mounting portion, so as to oppose said light-emitting element across said substrate, and electrically connected to said second electrode patterns; and
    a synthetic resin covering said light-emitting element and said light-receiving element.

2. A surface-mounted photocoupler according to claim 1, wherein said mounting portion has a horizontal portion, and wherein said light-emitting element and light-receiving element are attached to said horizontal portion.

3. A surface-mounted photocoupler according to claim 2, wherein said mounting portion has a frusto-conical configuration.

4. A surface-mounted photocoupler according to claim 2, wherein said substrate is composed of thermoplastic polyimide film.

5. A surface-mounted photocoupler according to claim 1, wherein said light-emitting element comprises an LED having a rectangular configuration, and wherein said LED has a bottom side fixed to said one surface of said mounting portion, a light-emitting portion formed on said bottom side, side faces and electrodes formed on said side faces and connected to said first electrode patterns.

6. A surface-mounted photocoupler according to claim 1 or 5, wherein said light-receiving element comprises a phototransistor having a rectangular configuration, and wherein said phototransistor has a bottom side fixed to said other surface of said mounting portion and a base, an emitter and a collector formed on the bottom side, said emitter and collector being connected to said second electrode patterns.

7. A surface-mounted photocoupler comprising:
    a light-transparent substrate including a flat mounting portion and edge portions;
    first and second electrode patterns formed on one and other surfaces of said flat mounting portion, respectively;
    a light-emitting element attached to said one surface of mounting portion and electrically connected to said first electrode patterns;
    a light-receiving element attached to said other surface of said mounting portion, so as to oppose said light-emitting element across said substrate, and electrically connected to said second electrode patterns; and
    a synthetic resin covering said light-emitting element and said light-receiving element and formed in a rectangular configuration;
    wherein said edge portions are bent and affixed along the outer periphery of said syntectic resin covering one of said light-emitting element and light-receiving element.

8. A surface-mounted photocoupler comprising:
    a light-transparent substrate including a mounting portion one side of which is projected to form a protrusion and the opposite side of which forms a recess and a horizontal portion at the center of said mounting portion;
    first and second electrode patterns formed on one and other surfaces of said horizontal portion of said mounting portion, respectively;
    an LED formed in a rectangular configuration and having a bottom side fixed to said one surface of said horizontal portion of said mounting portion, a light-emitting portion formed on said bottom side, side faces and electrodes formed on said side faces and electrically connected to said first electrode patterns;
    a phototransistor formed in a rectangular configuration and having a bottom side fixed to said other surface of said horizontal portion of said mounting portion, so as to oppose said LED across said horizontal portion, and a base, an emitter and a collector formed on the bottom side, said emitter and collector being electrically connected to said second electrode patterns, and said base facing said light-emitting portion of said LED through said horizontal portion of said mounting portion; and
    a synthetic resin coveting said LED and said phototransistor.

\* \* \* \* \*